United States Patent
Miller

(10) Patent No.: US 8,972,806 B2
(45) Date of Patent: Mar. 3, 2015

(54) SELF-TEST DESIGN FOR SERIALIZER / DESERIALIZER TESTING

(71) Applicant: Applied Micro Circuits Corporation, Sunnyvale, CA (US)

(72) Inventor: Glen Miller, Haverhill, MA (US)

(73) Assignee: Applied Micro Circuits Corporation, Sunnyvale, CA (US)

( * ) Notice: Subject to any disclaimer, the term of this patent is extended or adjusted under 35 U.S.C. 154(b) by 128 days.

(21) Appl. No.: 13/654,833

(22) Filed: Oct. 18, 2012

(65) Prior Publication Data
US 2014/0115409 A1    Apr. 24, 2014

(51) Int. Cl.
G01R 31/28      (2006.01)
G01R 31/3177    (2006.01)
G01R 31/317     (2006.01)

(52) U.S. Cl.
CPC ........ *G01R 31/3177* (2013.01); *G01R 31/3171* (2013.01); *G01R 31/31715* (2013.01)
USPC ........................................... 714/724; 700/94

(58) Field of Classification Search
USPC ........................................... 714/724; 700/94
See application file for complete search history.

(56) References Cited

U.S. PATENT DOCUMENTS

| | | | |
|---|---|---|---|
| 5,854,804 A * | 12/1998 | Winer et al. | 372/38.1 |
| 7,308,371 B2 | 12/2007 | Ong | |
| 7,502,326 B2 | 3/2009 | Evans | |
| 7,526,033 B2 | 4/2009 | Sindalovsky et al. | |
| 7,773,667 B2 | 8/2010 | Sindalovsky et al. | |
| 8,275,025 B2 | 9/2012 | Abel et al. | |
| 2005/0210341 A1* | 9/2005 | Chiba et al. | 714/701 |
| 2005/0229062 A1* | 10/2005 | Volkerink et al. | 714/738 |
| 2010/0164584 A1* | 7/2010 | Watanabe et al. | 327/276 |
| 2011/0320999 A1* | 12/2011 | Rajski et al. | 716/136 |
| 2012/0158348 A1* | 6/2012 | Watanabe et al. | 702/125 |
| 2013/0170525 A1* | 7/2013 | Asaad et al. | 375/219 |
| 2013/0310959 A1* | 11/2013 | Sandu et al. | 700/94 |

* cited by examiner

*Primary Examiner* — Sam Rizk
(74) *Attorney, Agent, or Firm* — Amin, Turocy & Watson, LLP

(57) ABSTRACT

Providing for testing of digital sequencing components of an integrated chip is described herein. By way of example, self-test procedures are provided for unidirectional integrated chips that have different sequence generation (e.g., transmission) and sequence monitoring (e.g., receiving) frequencies. A test logic component(s) can be added to an integrated chip to match the sequence generation frequency to the sequence monitoring frequency. This can facilitate self-testing of unidirectional sequence generating components, by modifying a generated sequence at a first datarate to be receivable at a second datarate, and directing the modified sequence to sequence monitoring components of the integrated chip configured to operate at the second datarate.

20 Claims, 9 Drawing Sheets ent. Thus, to match changes in capabilities of test equipment, the testing equipment can require periodic upgrades. This is a particular aspect of current research and development that is often overlooked but of significant importance in electronic components.

SELF-TEST DESIGN FOR SERIALIZER / DESERIALIZER TESTING

TECHNICAL FIELD

The subject application for patent relates generally to design testing for electronic circuits, and more particularly to digital testing of a serializer/deserializer component of an electronic circuit.

BACKGROUND

Electronic communications, whether over a local or wide-area network or among components of a local bus, can involve a variety of programmed actions and protocols. For instance, data to be transmitted from one electronic component to another is often organized into subgroups of transmitted information. A system of acknowledgments is often employed to coordinate transmission of respective subgroups of the information and for identifying and retransmitting lost subgroups, to provide reliability.

In the network context, information is often transmitted by one or more packets of data. The packets are organized into a particular form, with a payload that stores one or more subgroups of the data, and with transmission control information to facilitate routing the packet to a proper destination. The transmission control information can comprise a header, a tail, etc., in which this transmission control information can be specified. This information can include data for identifying the packet (e.g., within a group of packets, such as a stream), identifying a transmitting component, identifying a recipient component, and so on.

Once data is prepared for transmission, the data is provided to a device configured to generate signals to convey the data over a communication path, such as a bus, a network, and so on. As a particular example, in the context of optical signal communication, a serializer/deserializer (SerDes) might be employed for generating such signals and transmitting the signals over a communication path. The SerDes is a device configured to convert a stream(s) of serial information into multiple parallel streams of the information, or convert the multiple parallel streams of the information into the stream of serial information. The SerDes can often be utilized to facilitate preparing a set of data for transmission by a sending component, or in receiving transmitted data at a receiving component.

Electronic communication circuitry, like many electronic components, is often tested by a manufacturer in conjunction with quality control procedures. Automated test equipment (ATE), for instance, is a device that can be connected to an electronic communication chip for such purposes. The ATE can have various functions and configurations, and can include a load board for matching to various test pin configurations, including a particular test pin configuration of a test pin field of the electronic communication chip. In some cases, an ATE load board simply expands an input/output of a device under test to the pins on the ATE load board. In other cases, an ATE load board can have additional components added to the ATE load board to meet particular test requirements of the electronic device. For instance, passive components such as capacitors or resistors can be added to implement filters external to the device under test, or the like.

Though an ATE can be reconfigured to some degree to meet particular requirements of a device under test, reconfiguration can be time-consuming, significantly delaying or adding overhead to otherwise automated test processes. Therefore, capabilities of quality control test equipment are often improved to match the capabilities of electronic circuitry. This can add significant cost overhead to testing equipment, however, as consumer demand for electronic circuitry often requires increasing capabilities of the underlying test equipment. Thus, to match changes in capabilities of test equipment, the testing equipment can require periodic upgrades. This is a particular aspect of current research and development that is often overlooked but of significant importance in electronic components.

SUMMARY

The following presents a simplified summary in order to provide a basic understanding of some aspects described herein. This summary is not an extensive overview of the disclosed subject matter. It is intended to neither identify key nor critical elements of the disclosure nor delineate the scope thereof. Its sole purpose is to present some concepts in a simplified form as a prelude to the more detailed description that is presented later.

One or more aspects of the subject disclosure provide for testing of digital sequencing components of an integrated circuit chip (also referred to herein as an integrated chip). In particular aspects, self-test procedures are provided for integrated chips that have different sequence generation (e.g., transmission) and sequence monitoring (e.g., receiving) frequencies. As a particular example, a test logic component(s) can be added to an integrated chip to match the sequence generation frequency to the sequence monitoring frequency. This can facilitate self-testing of sequence generating components, by directing a generated sequence from the sequence generating components to sequence monitoring components of the integrated chip.

According to particular aspects, self-test of sequence generation components can be facilitated by causing repetition of generated bits. This repetition can have the effect of throttling the sequence generation components from a first datarate—at which the sequence generation components are configured to operate—to a second datarate. Further, this second datarate can be a rate at which sequence monitoring components are configured to operate, facilitating self-test of an integrated chip. The number of times a generated bit is repeated can be equal to N, where N is an integer equal to a ratio of the first datarate and the second datarate.

According to further aspect of the subject disclosure, an integrated chip is disclosed comprising having a pseudo-random bit sequence (PRBS) generator and a serializer/deserializer (SerDes) for generating and output of a data sequence. Further, the PRBS generator and SerDes are configured to generate and output the data sequence at a first datarate. The integrated chip also comprises a PRBS monitor configured to receive a bit sequence at a second datarate, slower than the first datarate. In addition, the integrated chip can comprise a test logic component that can be activated to cause a sequence generated at the first datarate by the PRBS generator to also be properly received at the second datarate. Alternatively, the test logic component can be configured to modify the sequence generated by the PRBS generator at the first datarate in a manner enabling the sequence to be properly received at the second datarate. Further to the above, the disclosed integrated chip can have automated test equipment (ATE) load board connection pins, including an output ATE connection and an input ATE connection. The output ATE connection can transmit a sequence generated at the first data rate and receivable at the second datarate from the integrated chip to the ATE load board. In addition, the input ATE connection can be provided the sequence for receiving at the PRBS monitor. Accordingly, the PRBS monitor can receive and identify errors in the sequence generated by the integrated chip, thereby facilitating self-test of the PRBS generator.

In at least one additional aspect of the subject disclosure, an integrated chip is disclosed comprising a framed pattern generator configured to generate a data sequence at a first datarate. In addition, the integrated chip can comprise a pattern framer and error monitor configured at a second datarate. To facilitate self-test of the data sequence generated by the framed pattern generator, the data sequence can be transmitted over a data channel and received as an input at the pattern framer and error monitor. Particularly, the data sequence can be generated for the self-test in a particular manner that, while generated at the first datarate, can be received at the second datarate. In at least one aspect, the data sequence can be compiled from generated bits and copied bits. The data sequence is compiled by generating a bit, repeating the generated bit N times, and then generating and repeating a subsequent bit, where N is an integer equal to the first datarate divided by the second datarate. In this manner the framed pattern generator can be operated at full speed (e.g., at the first datarate) while still being tested by the pattern framer and error monitor at the second datarate, facilitating full-speed self-test of an integrated chip, having differing output and input frequencies.

The following description and the annexed drawings set forth in detail certain illustrative aspects of the subject disclosure. These aspects are indicative, however, of but a few of the various ways in which the principles of various disclosed aspects can be employed and the disclosure is intended to include all such aspects and their equivalents. Other advantages and novel features will become apparent from the following detailed description when considered in conjunction with the drawings.

DETAILED DESCRIPTION

Figure 1:
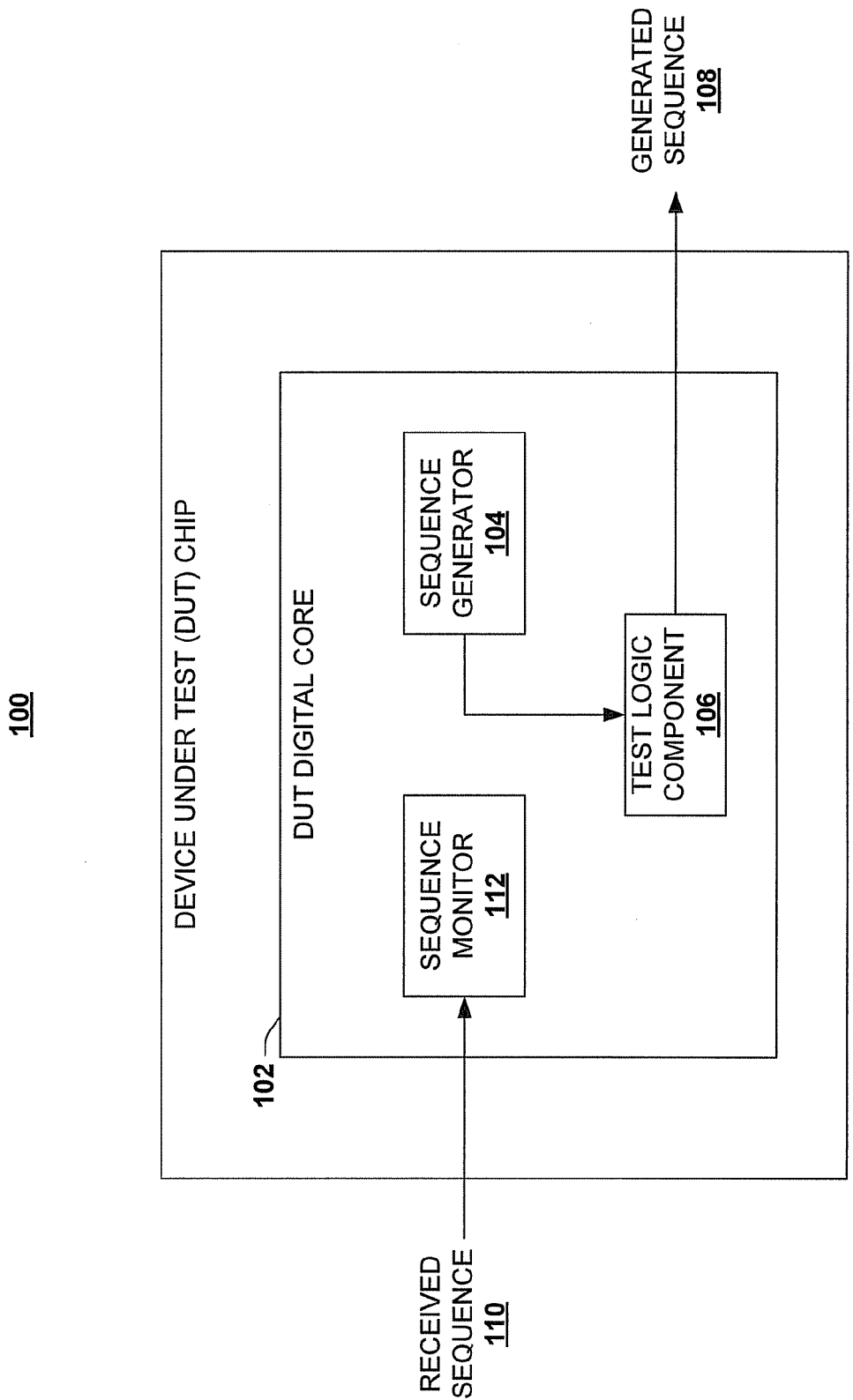
FIG. 1 illustrates a block diagram of an example integrated chip that facilitates self-test at diverse output and receive frequencies, in an aspect(s).

The disclosure herein is described with reference to the drawings, wherein like reference numerals are used to refer to like elements throughout. In the following description, for purposes of explanation, numerous specific details are set forth in order to provide a thorough understanding of the subject innovation. It may be evident, however, that various disclosed aspects can be practiced without these specific details. In other instances, well-known structures and devices are shown in block diagram form in order to facilitate describing the subject innovation.

As utilized herein, terms "component," "system," and the like are intended to refer to an electronic or computing entity, either hardware, software (e.g., in execution), or firmware. For example, a component can be one or more semiconductor transistors, an arrangement of semiconductor transistors, a circuit, data transfer or integration circuitry, an electronic clock, a process running on a processor, a processor, an object, a state machine, a computer, etc. By way of illustration, a circuit, a transistor array electrically connected with the circuit, or a controller that manages data flow between the transistor array and the circuit can be a component. Furthermore, an apparatus can comprise one or more components that operate together as a system. For instance, the apparatus can comprise an arrangement of electronic hardware, data transfer circuits, logical control circuits, memory circuits that store processing instructions, and a processing circuit that implements the processing instructions in a manner suitable to perform an electronic or computing task.

Furthermore, various aspects of the disclosed subject matter can be implemented as a method, apparatus, or article of manufacture using typical manufacturing, programming or engineering techniques to produce hardware, firmware, software, or any suitable combination thereof to control an electronic device to implement one or more of the disclosed aspects. The term "article of manufacture" as used herein is intended to encompass an electronic device, a semiconductor device, a computer, or a computer program accessible from any computer-readable device, carrier, or media. By way of example, and not limitation, computer-readable media can include hardware media, or software media. In addition, the media can include storage media, transport media or communication media. For example, computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include a data transfer bus, a signal interface (e.g., a wireless communication interface), or the like. Of course, those skilled in the art will recognize many modifications can be made to this configuration without departing from the scope or spirit of the disclosed subject matter.

Communication media typically embodies computer-readable instructions, data structures, program modules or other data in a modulated data signal such as a carrier wave or other transport mechanism, and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer-readable media.

Various aspects of the subject disclosure provide for self-testing of an integrated chip having different transmit and receive frequencies. Moreover, the self-testing can be implemented in conjunction with a simple data channel suitable for routing an output sequence generated by the integrated chip, to an input of the integrated chip. Accordingly, various aspects disclosed herein can provide self-testing of an integrated chip with general purpose automated test equipment (ATE). Thus, changes in chip frequencies need not necessarily require a change in ATE test frequencies.

Self-test of integrated circuits can be implemented with an automated test equipment (ATE). An ATE can comprise a load board that is utilized to interface with a device under test—generally an integrated circuit chip (also called an integrated chip). In some cases, an ATE load board can be employed to configure a generic test pin field of the ATE to the individual characteristics of a device under test. In some cases, the ATE load board is limited to expanding the input/output (I/O) connecter of the device under test to the test pin field of the ATE. However, in some cases additional circuitry is added to the ATE load board if test requirements for the device under test exceed capabilities of the ATE. As one example, passive circuit components (e.g., resistors, capacitors, ... ) might be added to an ATE load board to create signal filters external to an integrated chip, thereby facilitating testing of such device.

One component that can be utilized for sequence generation or sequence monitoring of an integrated chip is a serializer/deserializer (SerDes). A SerDes can receive a stream of bits generated by a bit generator and parallelize the stream of bits for transmission over a multi-pin channel, for instance. On a receiving or input end, a SerDes can serialize a received parallel sequence of bits, to facilitate reception and error testing of the received signal.

In the case of high speed/high frequency SerDes components, commercial ATE testers often lack the ability to source or sink signals utilized for testing the I/O characteristics of high frequency components. Accordingly, high frequency SerDes devices can be manufactured to include a high frequency bit generator and high frequency bit monitor with well-known characteristics to facilitate testing of the high frequency SerDes. Particularly, where an integrated chip comprises bidirectional SerDes components which operate at a common datarate, a process known as self-test or loopback test can be implemented via an ATE load board. To perform the loopback test, the ATE load board redirects a sequence generated by the high frequency bit generator at the output of the integrated chip back to the high frequency bit monitor at an input of the integrated chip.

Loopback testing can be a useful procedure to facilitate quality control in integrated chips, but it does have some drawbacks. One significant drawback is that loopback testing cannot be employed with unidirectional transmission where the input and output SerDes operate at different frequencies, or datarates. One way to address this problem for integrated chips having unidirectional transmission is to add active silicon components to an ATE load board. These active components are selected to provide controllability and compatibility required to test the output of a SerDes generator. However, this approach also has several drawbacks. For instance, active components can be more prone to failure than other components (e.g., passive components, ... ). Failure of active components in such circumstances can reduce reliability of an ATE load board. Further, ATE tests are commonly contracted out to external entities specializing in testing integrated chips. Contract companies may not be familiar with specifics of an ATE load board, and thus troubleshooting failures can occur. By providing self-test of unidirectional traffic having different I/O datarates, these problems can at least in part be obviated by various aspects of the subject disclosure.

Referring now to the drawings, FIG. 1 depicts a block diagram of an example device under test (DUT) integrated chip 100 (also referred to as DUT chip 100) according to one or more aspects of the subject disclosure. DUT chip 100 can comprise any suitable integrated circuit device having data sequence generation capability for data transmission, and data sequence monitoring capability for data receiving, thereby facilitating electronic communications. In addition, DUT chip 100 can be a unidirectional device having data transmission components separate from data reception components. Thus, data transmission components of DUT chip 100 need not be configured to receive a data sequence, and data reception components of DUT chip 100 need not be configured to transmit the data sequence.

As depicted, DUT chip 100 can comprise a DUT digital core 102. Further, DUT digital core 102 can comprise a sequence generator 104 connected to a test logic component 106. Sequence generator 104 can be various suitable types of electronic circuits or components suitable for generating a stream of bits (in the digital domain) or signal information (in the analog domain, optionally coupled with an analog to digital converter (ADC)). In some aspects, sequence generator 104 can comprise a pseudo-random bit sequence (PRBS) generator. In other aspects, sequence generator 104 can comprise a framed pattern generator. In still other aspects, sequence generator 104 can comprise other components or circuits for generating the stream of bits or signal information, or a suitable combination thereof. In addition to the foregoing, sequence generator 104 can be configured to operate (e.g., generate a sequence of bits) at a first datarate (or frequency). In some aspects, sequence generator 104 can be configured to operate at a first set of datarates, the first set comprises multiple datarates. In these aspects, sequence generator 104 can be programmed to operate at one or another datarate of the first set of datarates, for instance.

Test logic component 106 can be configured to cause sequence generator 104 to output a data sequence having a modified datarate from DUT digital core 102. Particularly, the modified datarate can be different from the first datarate, or different from at least one datarate of the first set of datarates. Alternatively, test logic component 106 can be configured to receive a data sequence from sequence generator 104 at the first datarate (or one of the first set of datarates), and convert the data sequence to a converted data sequence that is at least receivable at a second datarate (e.g., by a sequence monitor 112) other than the first datarate (or the one of the first set of datarates). The converted data sequence can then be output by test logic component 106 (or by sequence generator 104—although not depicted as such) from DUT digital core 102 as a generated sequence 108.

According to one or more disclosed aspects, the first datarate and the second datarate can have a ratio of N, where N is a suitable positive integer greater than one. Test logic component 106 can cause the data sequence to be converted to the converted data sequence in a variety of manners. In one aspect(s) of the subject disclosure, test logic component 106 can cause the data sequence to be converted to the converted data sequence by repeating each bit of the generated sequence N times, and compiling the converted data sequence from generated bits followed by repeated bits. According to this aspect(s), the converted data sequence can be properly received at a datarate that is N times smaller than a frequency at which sequence generator 104 operates. Accordingly, test logic component 106 can facilitate full speed operation of sequence generator 104 coupled with lower speed receiving and testing of a data sequence generated by sequence generator 104.

In still other aspects of the subject disclosure, test logic component 106 can be configured to operate selectively. For instance, test logic component 106 can be configured to be activated or deactivated. When activated, test logic component 106 can output, or cause sequence generator 104 to output, a converted sequence at a datarate that is different from the first datarate, or different from at least one datarate of the first set of datarates. When deactivated, sequence generator 104 can output the data sequence at the first datarate (or at the one of the first set of datarates) unaltered.

Generated sequence 108 can be received, monitored, locked onto, etc., by a suitable receiving component (e.g., sequence monitor 112) that is operative at least at the second datarate. In some aspects, generated sequence 108 can be properly received at multiple datarates. In at least one particular aspect of the subject disclosure, generated sequence 108 can be properly received at the first datarate and at the second datarate.

In addition to the foregoing, DUT digital core 102 can comprise sequence monitor 112 configured to obtain a received sequence 110. Sequence monitor 112 is configured to operate on at least one different frequency or datarate from sequence generator 104. Thus, for instance, sequence monitor can be configured to operate on the second datarate, as one example.

Sequence monitor 112 can be configured to lock onto received sequence 110, on the condition that received sequence 110 has a datarate, or an effective datarate (e.g., a readable datarate) that matches the at least one different datarate at which sequence monitor 112 operates (e.g., the second datarate). Once a sequence operating at the at least one different datarate is received at sequence monitor 112, sequence monitor 112 can perform one or more further operations. Such operations can include, for instance, identifying bit errors of received sequence 110, reporting bit errors of received sequence 110, tracking bit errors of received sequence 110, or some other suitable function. Thus, sequence monitor 112 can be utilized as an error test device for received sequence 110, in at least one aspect of the subject disclosure.

Figure 2:
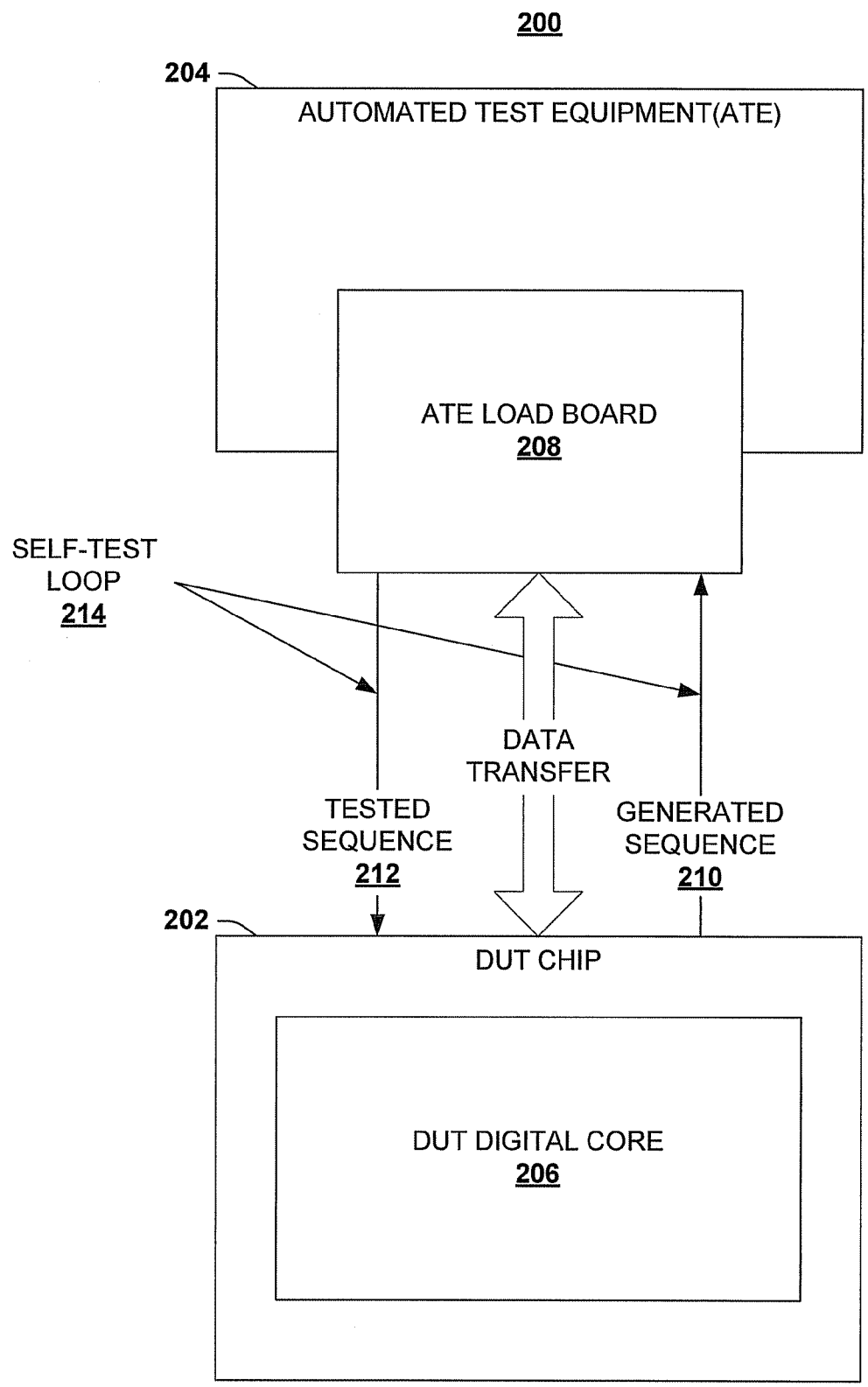
FIG. 2 depicts a block diagram of a sample sequence test for an integrated chip according to further aspects disclosed herein.

FIG. 2 illustrates a block diagram of an example testing 200 environment for an integrated chip, according to further aspects disclosed herein. Testing environment 200 can comprise a DUT chip 202 communicatively connected with an ATE 204. ATE 204 facilitates self-test for the DUT chip 202, for instance by redirecting a sequence output by DUT chip 202 back to an input of DUT chip 202. In at least some aspects, testing environment 200 can facilitate self-test for DUT chip 202 despite non-compatible output and input frequencies of DUT chip 202, alleviating problems associated with existing mechanisms for testing integrated chips.

DUT chip 202 can comprise a DUT digital core 206 configured to generate and output a transmitted data sequence, and configured to receive and analyze a received data sequence. In particular aspects, DUT digital core 206 is configured to generate the transmitted data sequence at a first datarate, and is configured to receive the received data sequence at a second datarate different from the first datarate. Particularly, the first datarate can be an integer multiple of the second datarate, such that the following relationship is satisfied:

$$N = \text{first datarate/second datarate},$$

where N is a positive integer greater than one.

DUT chip 202 can comprise an I/O pin field (not depicted) including an output pin field and an input pin field. DUT chip 202 can communicatively interface with ATE load board 208 via this I/O pin field. Accordingly, a generated sequence 210 output by DUT chip 202 can be received by ATE load board 208. ATE 204 can be configured to output generated sequence 210 received at ATE load board 208, and provide generated sequence 210 as a tested sequence 212 which can be provided to an input pin field of DUT chip 202. This configuration of test environment 200, in which a data sequence generated by DUT chip 202 is redirected to an input of DUT chip 202 can result in a self-test loop 214 for DUT chip 202. DUT chip 202 can lock onto and analyze tested sequence 212 for data errors, to effect the self-test of the data sequence output by DUT chip 202.

As described above, DUT chip 202 can have data generating components that operate at a first datarate, and data receiving components that operate at a second datarate. Accordingly, to facilitate the self-test of self-test loop 214, generated sequence 210 can be converted to the second datarate (e.g., being readable at the second datarate), to facilitate tested sequence 212 being readable by the receiving components of DUT chip 202. Thus, testing environment 200 can facilitate self-test for DUT chip 202 even where data transmitting components and data receiving components of DUT chip 202 are of incompatible datarates, or frequencies.

Figure 3:
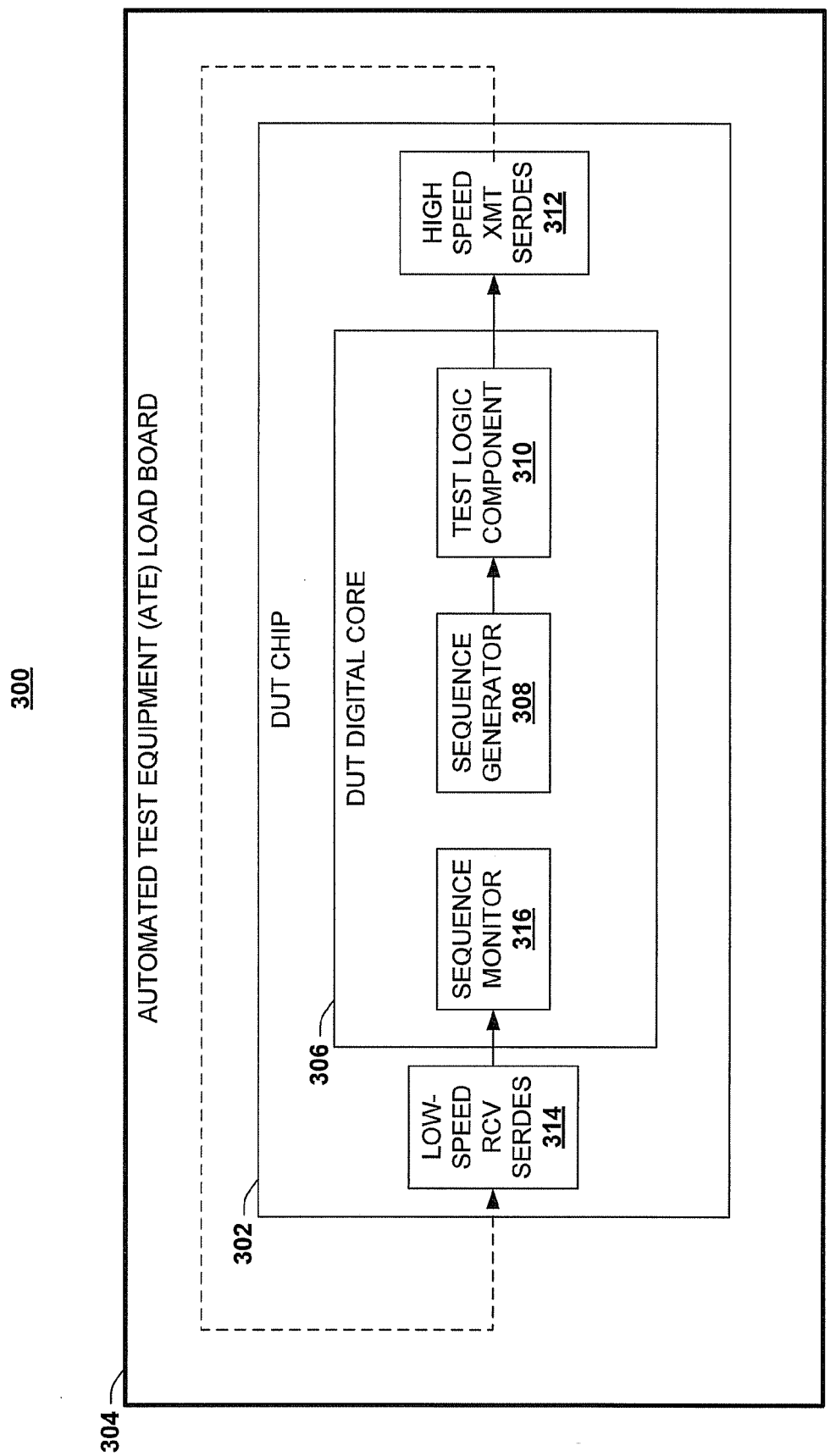
FIG. 3 illustrates a block diagram of an example integrated chip connected to an automated test equipment, according to other aspects.

FIG. 3 depicts a block diagram of a sample test environment 300 according to alternative or additional aspects of the subject disclosure. Test environment 300 can comprise a DUT chip 302 communicatively connected with an ATE load board 304 (e.g., see test environment 200 of FIG. 2, supra). DUT chip 302 includes a DUT digital core 306 for generating and receiving digital data sequences. Particularly, a sequence generator 308 can be configured to generate data sequences for DUT chip 306. The data sequences are generated at a first datarate, or one of a first set of datarates.

DUT digital core 306 can further comprise a test logic component 310. Test logic component 310 can operate to modify the first datarate (or modify datarates of the first set of datarates) to result in a data sequence that is receivable at a second datarate. In one aspect of the subject disclosure, test logic component 310 can be activated to cause sequence generator 308 to generate the data sequence to be receivable at the second datarate. In another aspect, test logic component 310 can be activated to receive a data sequence at the first datarate (or one of the first set of datarates) and convert the data sequence to a converted data sequence that is receivable at the second datarate. The data sequence receivable at the second datarate (converted, or modified data sequence) can then be output from DUT digital core 306.

Modifying the datarate of a generated sequence can be implemented in multiple alternative fashions. As one example, where sequence generator 308 is configured to generate a new bit every clock cycle at the first datarate, test logic component 310 can restrict the generation of new bits to every $N^{th}$ clock cycle, and cause a newly generated bit to be repeated N−1 times until the next $N^{th}$ clock cycle. For instance, in the case where N=5, every fifth bit is a newly generated bit, followed by four bits that are replicas of that newly generated bit. A segment of such a data sequence could be as follows:

$bit_{new1}$, $bit_{replicated1}$, $bit_{replicated1}$, $bit_{replicated1}$, $bit_{replicated1}$, $bit_{replicated1}$, $bit_{new2}$, $bit_{replicated2}$, $bit_{replicated2}$, $bit_{replicated2}$, $bit_{replicated2}$, $bit_{replicated2}$, . . . .

As an alternative example, when activated, test logic component 310 can be configured to queue newly generated bits provided by sequence generator 308 at the first datarate, replicate each newly generated bit N times, compile respective queued bits followed by the N replicated bits, and output the compiled bits at the first datarate. Though bits are output by at the first datarate, the sequence can be properly received at a datarate that is 1/N the first datarate, since newly generated bits are output by test logic component 310 only one out of every N such output bits. As yet another alternative example, sequence generator 308 can comprise a series of M bit generators each generating bits at a rate of 1/M times the first datarate. The bits can be combined together each clock cycle to produce a bitrate equal to the first bitrate. Test logic component 310 can be configured to cause a subset of the M bit generates to repeat a bit produced by another subset(s) of the M bit generators, thereby resulting in a subset of newly generated bits and a subset of replicated bits for a given clock cycle. For instance, where M equals five, test logic component 310 can cause four of the five bit generators to replicate a bit generated by one of the M bit generators, resulting in a data sequence that can be received at a frequency one fifth the first datarate (e.g., see FIG. 4, infra). Other examples for modifying the datarate known in the art or made known to one of ordinary skill in the art by way of the context provided herein are considered within the scope of the present disclosure.

The converted or modified data sequence is obtained by a high speed transmit SerDes 312. High speed transmit SerDes 312 can deserialize the stream of data comprising the converted/modified data sequence, thereby creating a parallel output sequence. This parallel output sequence is redirected by ATE load board 304 to an input of DUT chip 302, as described at FIG. 2, supra.

The redirected parallel output sequence is received by a low-speed receive SerDes 314, which serializes the parallel output sequence and provides the serialized output sequence to sequence monitor 316 as an input. Low-speed receive SerDes 314 or sequence monitor 314 can be configured to operate at a lower frequency or datarate compared to high speed transmit SerDes 312. Accordingly, under such configuration a data sequence generated by sequence generator 308 and output by high speed transmit SerDes 312 would not ordinarily be receivable by low-speed receive SerDes 314 or sequence monitor 316. However, by activation of test logic component 310, where the second datarate is a lower speed datarate receivable by low-speed receive SerDes 314 and sequence monitor 316, this incompatibility can be obviated for test environment 300.

Sequence monitor 316 can be configured to receive, or lock onto, a sequence having a datarate equal to the second datarate, as indicated above. Moreover, sequence monitor 316 can be configured to identify error bits of such a data sequence. Errors can be reported to DUT chip 302, or alternatively to ATE load board 304 to facilitate identifying error bits in the data sequence. In this manner, test environment 300 can be configured to automate testing of data sequences generated by DUT chip 302 without a need for active components or special configurations on ATE load board 304.

Figure 4:
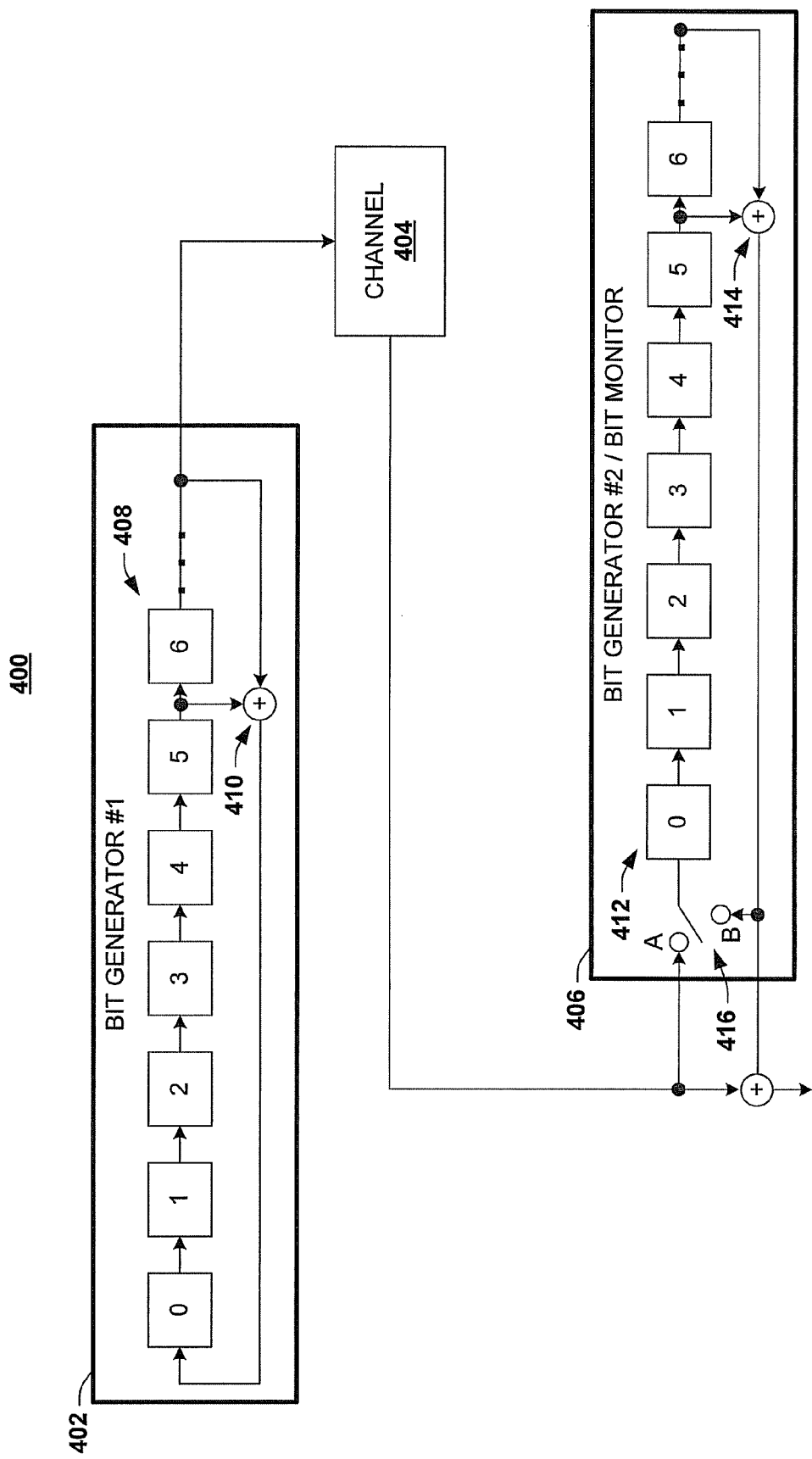
FIG. 4 depicts a block diagram of a sample bit generator and monitor of an integrated chip, according to particular aspects of the disclosure.

FIG. 4 illustrates a block diagram of an example system 400 for generating and testing a data sequence, according to one or more additional aspects of the subject disclosure. System 400 can comprise a first bit generator 402 (referred to as bit generator 402) configured to generate and output a sequence of bits. A sequence of bits output by bit generator 402 can be provided to a channel 404 for transporting the sequence of bits to a second bit generator 406, or bit monitor 406. Bit monitor 406 can be configured to analyze bits generated by bit generator 402. In at least one aspect, bit monitor 406 can be configured to analyze bit errors caused by bit generator 402 separately from channel 404, enabling bit monitor 406 to be fully predictive and thus self-synchronizing.

Bit generator 402 can comprise a set of binary bit generators 408 configured to generate bits for bit generator 402, which can be summed together by an adder 410 before being output from bit generator 402. The set of binary bit generators 408 can be configured according to different logical relationships, depending on a function of bit generator 402. As one example, bit generator 402 can be configured to output binary bits in a sequence. According to this configuration, at least a subset of the binary bit generators of set of binary bit generators 408 can be configured to generate a single binary bit on a given clock cycle (or subset of clock cycles, where suitable). In such case, respective binary bits are not summed into a multiple-bit configuration (e.g., a multi-bit word) by adder 410. Rather, respective binary bits are compiled in a sequence of binary bits. A number of the set of binary bit generators 408 actively generating bits (or multi-bit words, see below) to produce the sequence of binary bits will be proportionate to the datarate of the sequence. Thus, where five of set of binary bit generators 408 are generating bits on a gigahertz clock cycle, the output rate (and datarate in this instance) of binary bits is five gigabits per second, and so on.

As a second example, bit generator 402 can be configured to output a sequence of multi-bit words rather than a sequence of binary bits. In this case, a subset(s) of binary bits generated by set of binary bit generators 408 can be summed by adder 410 into a multi-bit word. The multi-bit word can be two binary bits, three binary bits, and so on, as selected by a particular configuration. If, for instance, an eight-bit word represented by three summed binary bits is desired, two subsets of set of binary bit generators 408 can be configured to generate two eight-bit words per clock cycle, and output a sequence of the two eight-bit words per clock cycle. Continuing the above example, since two subsets of binary bit generators are generating the eight-bit words per gigahertz clock cycle, the datarate for two eight-bit words per gigahertz clock cycle is sixteen gigabits per second, or an output rate of two billion eight-bit words per second, as another metric. It should be appreciated that other examples known in the art or made known to one of ordinary skill in the art by way of the context provided herein are considered within the scope of the present disclosure.

It should be appreciated that although bit generator 402 is depicted as having a total of seven binary bit generators, bit generator 402 can comprise a different number of binary bit generators instead. For instance, bit generator 402 (and bit monitor 406) can comprise a fewer number of binary bit generators, or a greater number of binary bit generators. Thus, the subject disclosure is not limited to a bit generator 402 having the number of the set of binary bit generators 408 depicted by FIG. 4.

Bit monitor 406 can comprise a second set of binary bit generators 412 that can be utilized for analyzing bit sequences received over channel 404. An adder 414 can be configured to sum together subsets of binary bits generated by set of binary bit generators 412 to create multi-bit words. Generally, adder 414 of bit monitor 406 can operate in a similar manner as described above with respect to summer 410 of bit generator 402.

To synchronize onto a received data sequence, bit monitor 406 can be configured to connect a switch 416 to a first contact point indicated at point A. When connected to point A, bit monitor 406 receives the bit sequence generated by bit generator 402 as modified (if at all) by channel 404. When a predetermined number of bits have been observed without error, switch 416 is flipped to a second contact point indicated at point B, enabling analysis of channel 404. In this manner bit monitor 406 can be operated in a fully predictive manner, for determining whether errors are inserted by channel 404. This property facilitates bit monitor 406 being self-synchronizing.

Figures 5A, 5B:
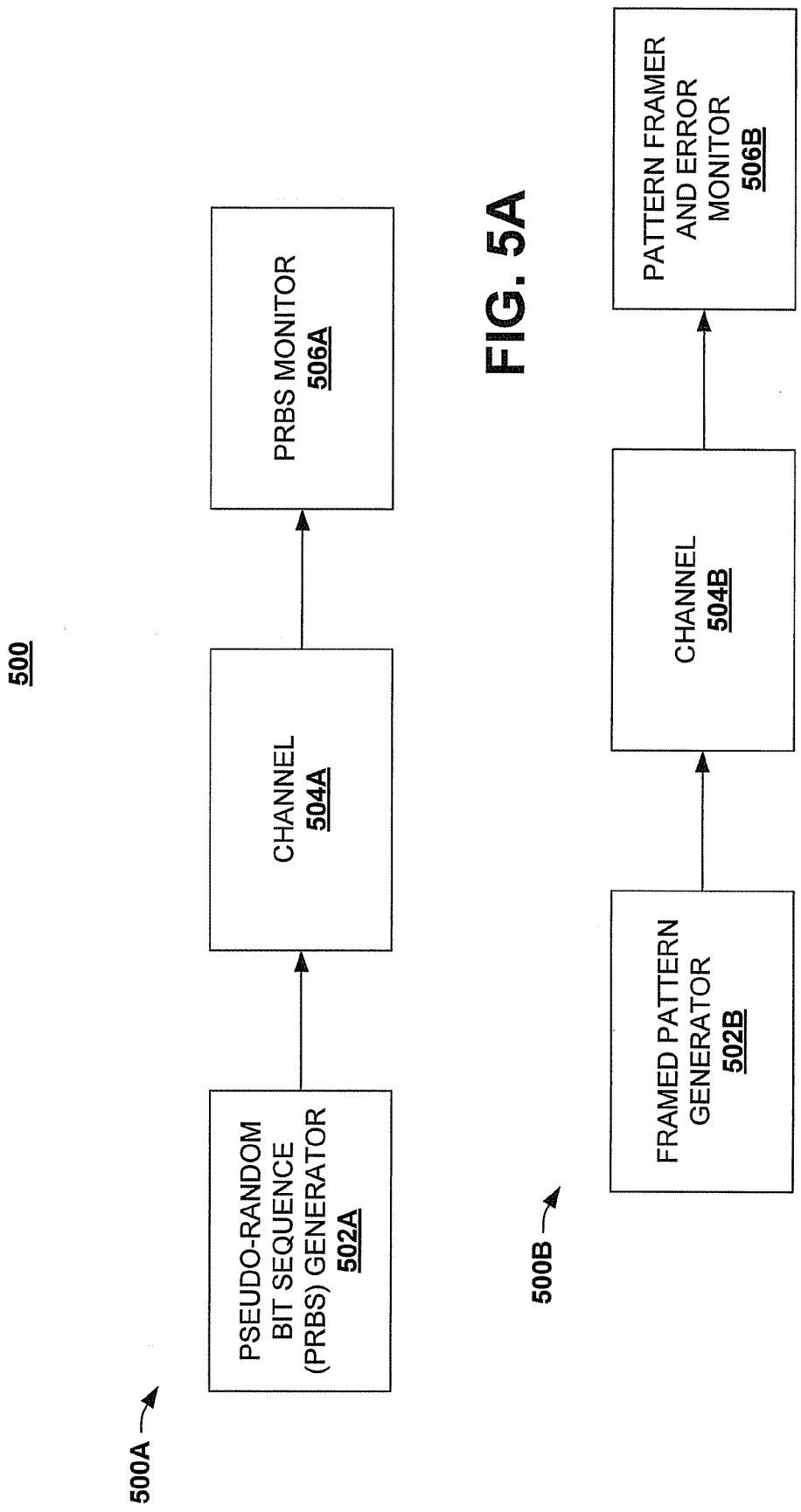
FIGS. 5A and 5B illustrate respective block diagrams of alternative sequence generating and receiving components of an integrated chip in another aspect.

FIGS. 5A and 5B depict block diagrams of example bit sequence testing environments 500A, 500B according to one or more further aspects of the subject disclosure. Testing environment 500A is a testing environment comprising PRBS components for generating a data sequence(s) and monitoring/error detection of a generated data sequence(s). As depicted, testing environment 500A can comprise a PRBS generator 502A for generating data sequences. PRBS generator 502A can be configured to generate a data sequence that comprises binary bits compiled into a sequence, in some aspects of the subject disclosure. In other aspects, PRBS generator 502A can be configured to generate a data sequence that comprises multi-bit data words compiled into a sequence. In still other aspects, PRBS generator 502A can be configured to generate a data sequence that comprises a like composition of data bits or words compiled into a sequence, or a suitable combination of the foregoing. Data sequences generated by PRBS generator 502A are output to a channel 504A. Channel 504A can introduce changes to a data sequence output by PRBS generator 502A, whether by design or inadvertently. The data sequences, with any changes by channel 504A, are then provided to PRBS monitor 506A. PRBS monitor 506A can be configured to synchronize onto a received data sequence from channel 504A, and detect error bits contained within the received data sequence. Additionally, PRBS monitor 506A can sample channel 504A to identify and subtract out changes in the received data sequence induced by channel 504A. This can increase accuracy in PRBS monitor 506A in terms of identifying actual errors of PRBS generator 502A.

Test environment 500B provides an alternative mechanism for generating and error-testing a data sequence. Test environment 500B comprises a framed pattern generator 502B that can be configured to create a frame with known characteristics. The frame can also be configured to be located by a pattern framer and error monitor 506B after being transmitted through a channel 504B. Upon locating the frame, pattern framer and error monitor 506B can sample channel 504B to determine errors in the channel. Errors in the channel can be subtracted from a received frame, to test the generated frame independent of effects of channel 504B.

Figure 6:
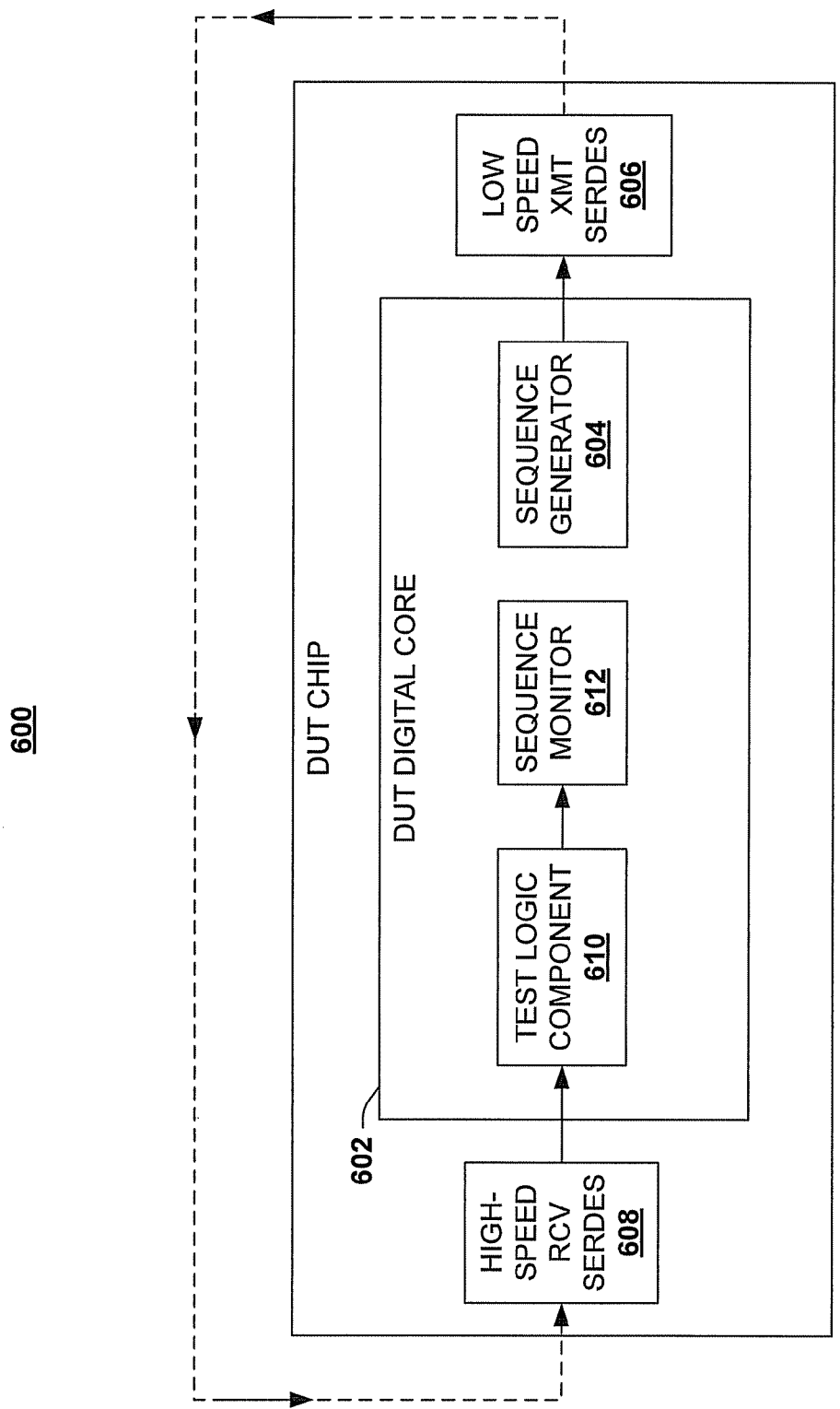
FIG. 6 depicts a flowchart of a sample method for self-test of an integrated chip at different transmit and receive frequencies.

FIG. 6 depicts a block diagram of a sample integrated chip 600 (DUT chip 600) according to alternative or additional aspects of the subject disclosure. DUT chip 600 can be a unidirectional device having different data generation and data monitoring rates, as described herein. However, DUT chip 600 comprises a low speed output and high speed input, as opposed to high speed output and low speed input as described in other aspects herein. Thus, it should be understood that alternative aspects of one or more aspects of the subject disclosure can be applied in conjunction with other disclosed aspects, in various suitable combinations.

DUT chip 600 can comprise a DUT digital core 602. DUT digital core 602 can be configured to generate digital sequences, as is described herein or known in the art, as well as to receive data sequences and identify errors in the received data sequences. Accordingly, DUT digital core 602 can comprise a sequence generator 604 configured to generate and output a digital sequence at a first datarate. The digital sequence is received at a low speed transmit SerDes 606 of DUT chip 600, which receives the digital sequence and parallelizes the sequence for transmission from DUT chip 600 (e.g., on a data channel). Note that low speed transmit SerDes 606 has a low datarate or data frequency with respect to an input of DUT chip 600. Thus, the relative nature of the speed is with respect to other components of DUT chip 600.

DUT chip 600 can further comprise a high speed receive SerDes 608. High speed receive SerDes 608 can be configured to receive a parallel stream of data and serialize the received stream of data. Thus, upon receiving a parallel stream of data output by low speed transmit SerDes 606, high speed receive SerDes 608 can serialize the parallel stream, and output a serial stream of data at the first datarate. The serial stream of data is provided to DUT digital core 602. A test logic component 610 of DUT digital core 602 can be configured to convert the serial stream of data from the first datarate to a second datarate that is larger than the first datarate by a factor of N. This conversion can be implemented by removing bits of the serial stream of data N−1 times, and compiling a second stream of data comprising 1/N bits of the serial stream without repeated bits. Thus, to illustrate, a first bit of the serial stream of data appears to be repeated N times at the second datarate, followed by a second bit of the serial stream of data which appears to be repeated N times at the second datarate, followed by a third bit of the serial stream of data which appears to be repeated N times at the second datarate, and so on. The modified second stream of data at the second datarate with the repeated bits removed is then provided to sequence monitor 612 for analysis and identification of errors.

The aforementioned diagrams have been described with respect to interaction between several components, or systems. It should be appreciated that such diagrams can include those components and systems specified therein, some of the specified components/systems, and/or additional components/systems. For example, system could include an integrated chip comprising a high speed transmit SerDes 312 and a low speed transmit SerDes 606. Sub-components could also be implemented as electrically connected to other sub-components rather than included within a parent architecture. Additionally, it should be noted that one or more disclosed processes could be combined into a single process providing aggregate functionality. For instance, sequence generator 604 can include low speed transmit SerDes 606, to facilitate generating a data sequence and parallelizing the data sequence by way of a single process. In addition, it should be appreciated that respective rows of disclosed memory architectures can be erased in groups (e.g., multiple rows erased concurrently) or individually. Moreover, it should be appreciated that multiple RRAM cells on a particular row can be programmed in groups (e.g., multiple RRAM cells programmed concurrently) or individually. Components of the disclosed architectures can also interact with one or more other components not specifically described herein but known by those of skill in the art.

Figure 7:
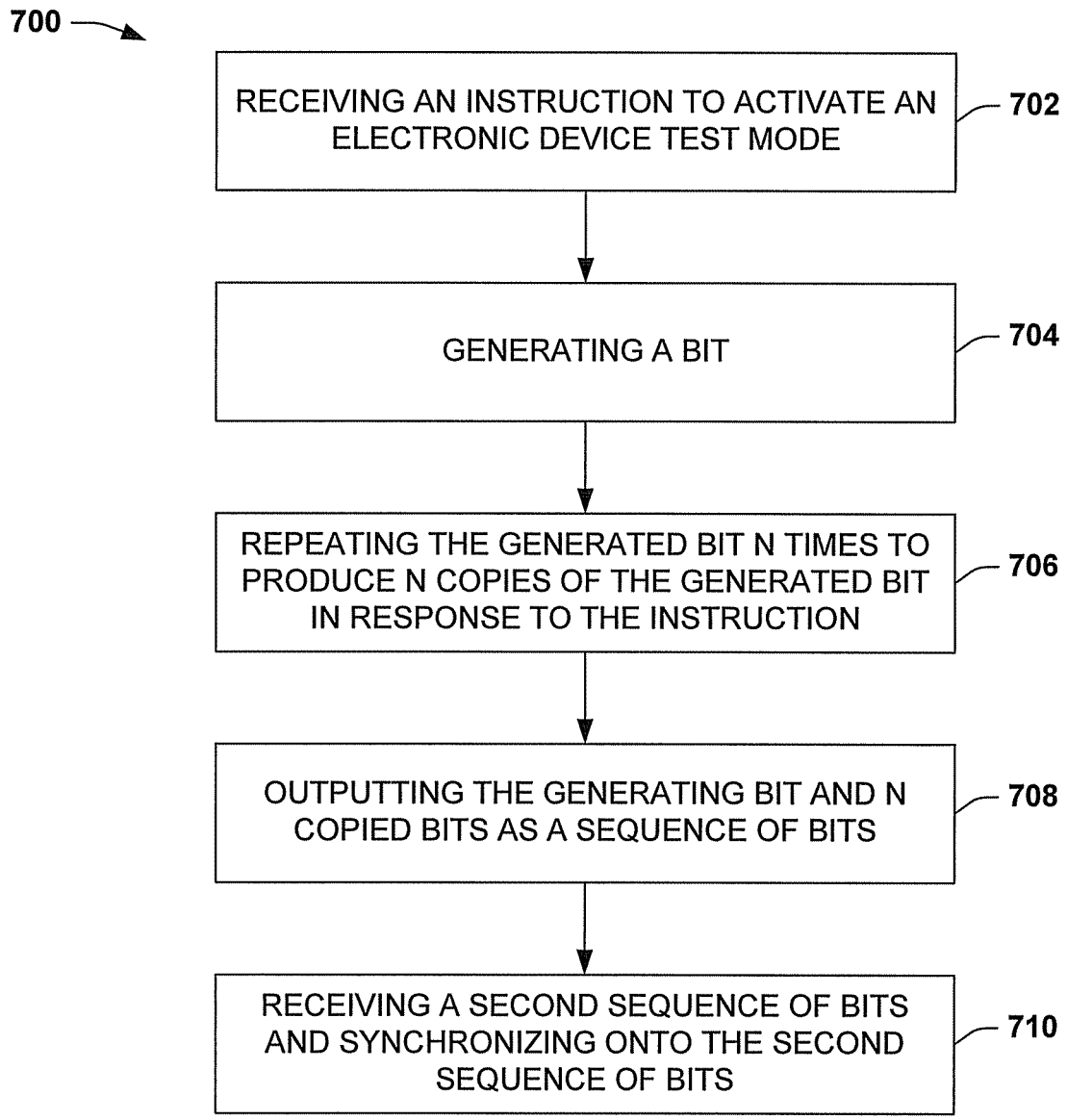
FIG. 7 depicts a flowchart of an example method for replicating bits of a bit sequence to facilitate self-test of disparate sequence components.
Figure 8:
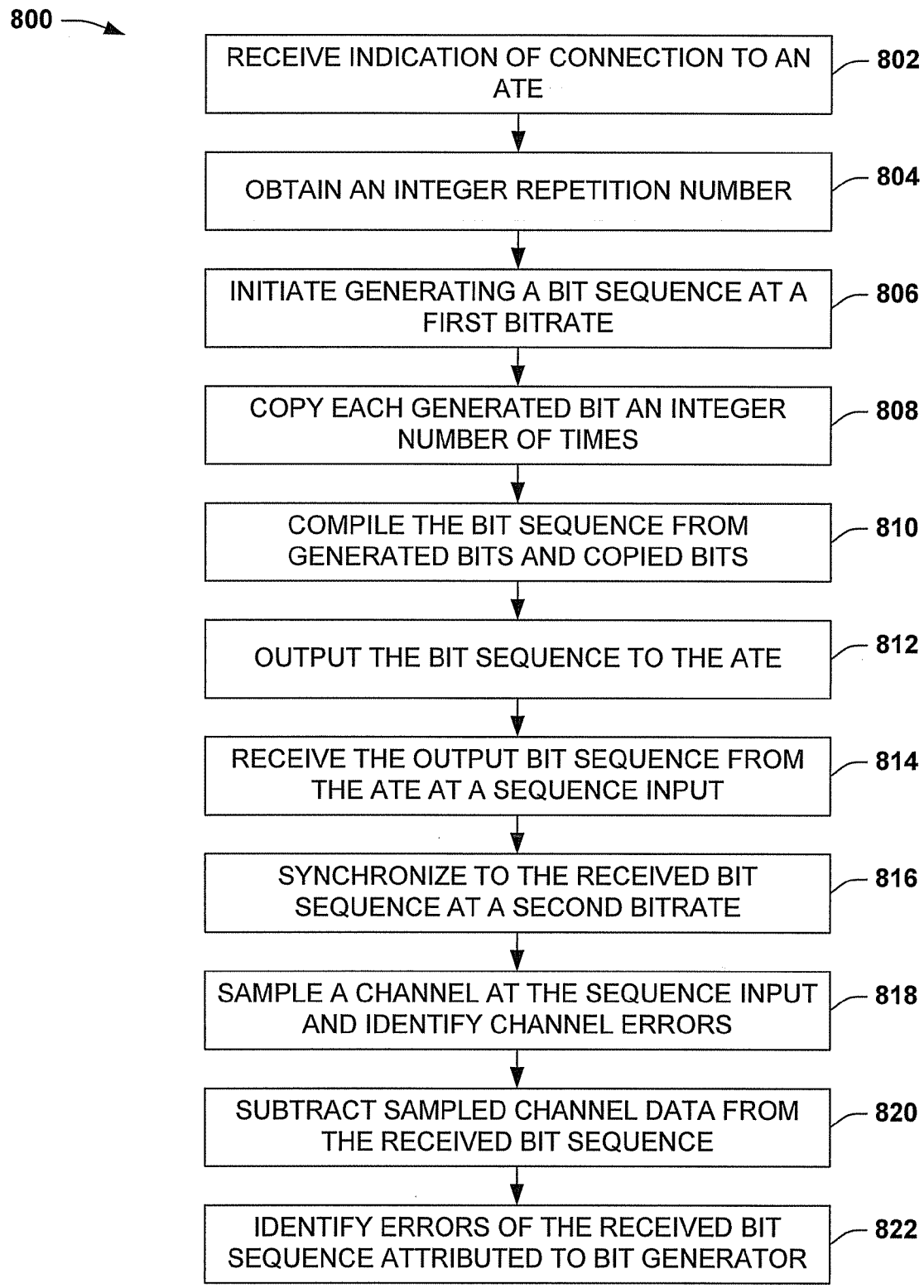
FIG. 8 illustrates a block diagram of an example environment for control and communication with an integrated chip.

In view of the exemplary diagrams described supra, process methods that can be implemented in accordance with the disclosed subject matter will be better appreciated with reference to the flow charts of FIGS. 7 and 8. While for purposes of simplicity of explanation, the methods 700, 800 are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods 700, 800 described hereinafter. Additionally, it should be further appreciated that the methods 700, 800 disclosed hereinafter and throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

FIG. 7 illustrates a flowchart of an example method 700 for providing testing of unidirectional integrated circuit chips according to further aspects of the subject disclosure. At 702, method 700 can comprise receiving an instruction to activate an electronic device test mode for an integrated circuit chip. At 704, method 700 can comprise generating a bit. At 706, method 700 can comprise repeating the generated bit an integer number of times n to produce n copies of the generated bit in response to receiving the instruction. At 708, method 700 can comprise outputting the generated bit and n copied bits as a sequence of bits. At 710, method 700 can comprise receiving a second sequence of bits and synchronizing onto the second sequence of bits. In some particular aspects, the second sequence of bits can comprise the generated bit and the n copies of the generated bit in a parallel form. In a particular aspect, the second sequence of bits can comprise the generated bit and the n copies of the generated bit in the parallel form, and comprising noise or errors induced by a channel between an output of the integrated circuit chip and an input of the integrated circuit chip. In at least one aspect, method 700 can additionally comprise identifying bit errors in the second sequence, bit errors of the channel between the output and input of the integrated circuit chip, or a suitable combination thereof, and reporting identified bit errors.

FIG. 8 depicts a flowchart of an example method 800 according to one or more additional aspects of the subject disclosure. Method 800 can comprise, at 802, receiving indication of a connection to an ATE. At 804, method 800 can comprise obtaining an integer repetition number suitable for an integrated circuit chip. In some aspects, the integer repetition number can be equal to a ratio of an output frequency and an input frequency of the integrated circuit chip. At 806, method 800 can comprise initiating generating a bit sequence at a first bitrate. At 808, method 800 can comprise copying each generated bit an integer number of times equal to the integer repetition number. At 810, method 800 can comprise compiling the bit sequence from generated bits and copied bits. At 812, method 800 can comprise outputting the bit sequence to the ATE. At 814, method 800 can comprise receiving the output bit sequence from the ATE at a sequence input. At 816, method 800 can comprise synchronizing to the received bit sequence, at a second bitrate. At 818, method 800 can comprise sampling a channel at the sequence input and identifying channel errors. At 820, method 800 can comprise subtracting sampled channel data from the received bit sequence. At 822, method 800 can comprise identifying errors of the received bit sequence attributed to a bit generator originating the received bit sequence.

Figure 9:
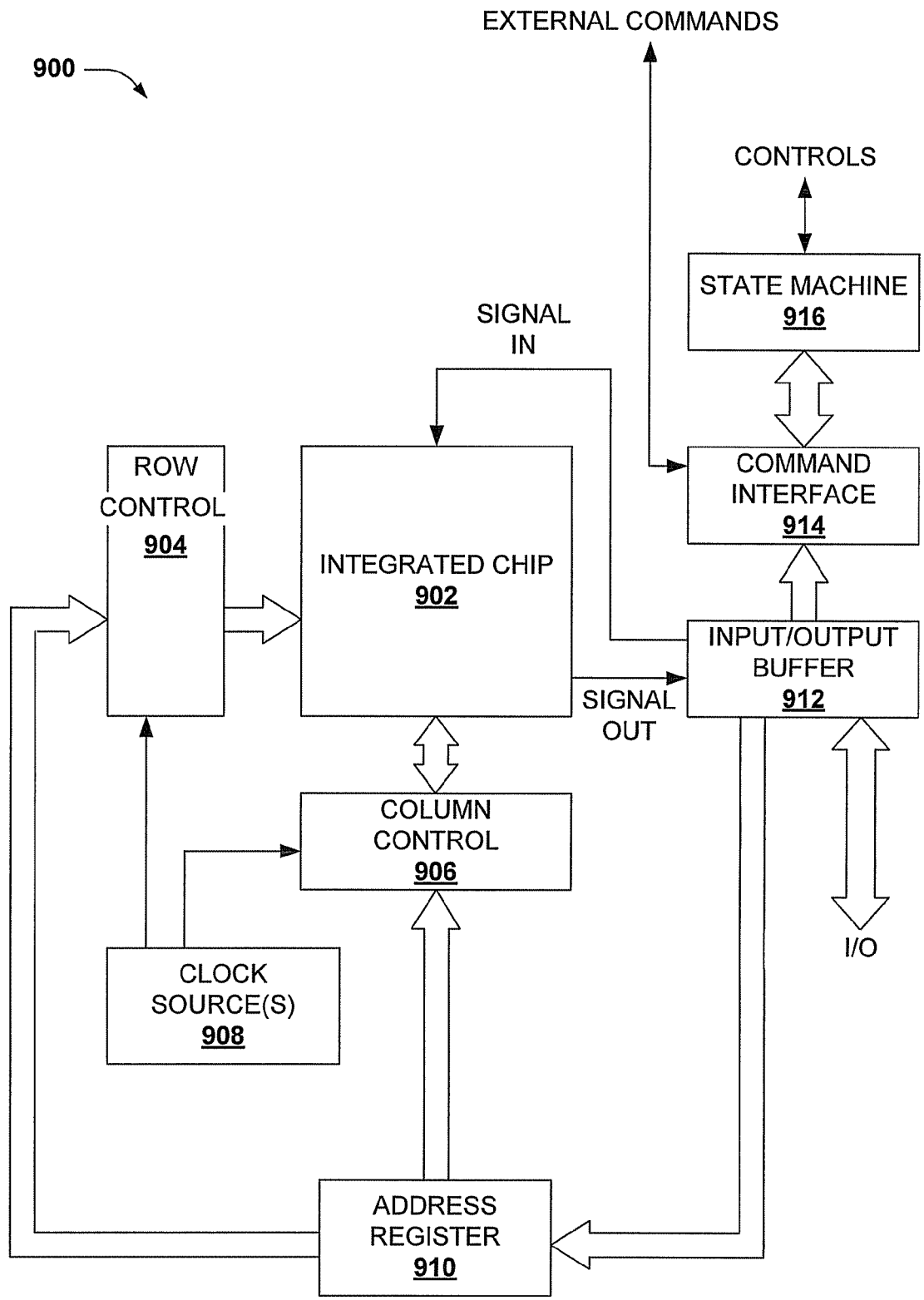
FIG. 9 depicts a block diagram of an example operating environment in which integrated chips can be programmed or controlled.

In order to provide a context for the various aspects of the disclosed subject matter, FIG. 9, as well as the following discussion, is intended to provide a brief, general description of a suitable environment in which various aspects of the disclosed subject matter can be implemented or processed. While the subject matter has been described above in the general context of digital electronic components and process methodologies for operating such components, those skilled in the art will recognize that the subject disclosure also can be implemented in combination with other digital or analog electronic components or process methodologies. Moreover, those skilled in the art will appreciate that the disclosed processes can be practiced with a processing system or a computer processor, either alone or in conjunction with a host computer, which can include single-processor or multiprocessor computer systems, mini-computing devices, mainframe computers, as well as personal computers, hand-held computing devices (e.g., PDA, phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a memory card, Flash memory module, removable memory, or the like. In a distributed computing environment, program modules can be located in both local and remote memory storage modules or devices.

FIG. 9 illustrates a block diagram of an example operating and control environment 900 for an integrated chip 902 according to aspects of the subject disclosure. In at least one disclosed aspect, integrated chip 902 can comprise a variety of RRAM memory cell technology. Particularly, integrated chip 902 can be arranged to facilitate self-test of data sequences generated by integrated chip 902, as described herein. It should be appreciated that control environment 900 is only one example of interfacing with and controlling integrated chip 900, and is not intended to limit the scope of the subject disclosure. Rather, other mechanisms, systems or architectures for control and communication with an integrated chip known in the art or made known to one of skill in the art by way of the context provided herein, are considered part of the subject disclosure.

A column controller 906 can be formed adjacent to integrated chip 902. Moreover, column controller 906 can be electrically coupled with a first set of data or control lines (e.g., bit lines, . . . ) of integrated chip 902. Column controller 906 can control respective ones of the first set of data or control lines, facilitating operation of one or more functions of integrated chip 902, providing program information for programmable portions of integrated chip 902, or the like.

In addition, operating and control environment 900 can comprise a row controller 904. Row controller 904 can be formed adjacent to column controller 906, and electrically connected with a second set of data or control lines (e.g., word lines, . . . ) of integrated chip 902. Row controller 904 can select or activate subsets of the second set of data or control lines to further facilitate operation of integrated chip 902. Thus, row controller 904 can operate alone or in conjunction with column controller 906 to facilitate operation of the one or more functions of integrated chip 902.

A clock source(s) 908 can provide respective clock pulses to facilitate timing for operations of row control 904 and column control 906. Clock source(s) 908 can further facilitate selection of subsets of the first set of control lines and the second set of control lines in response to external or internal commands received by operating and control environment 900. An input/output buffer 912 can be connected to an external host apparatus, such as a computer or other processing device (not depicted) by way of an I/O buffer or other I/O communication interface. In addition, input data can be transmitted to integrated chip 902 via signal input lines, and output data can be received from integrated chip 902 via signal output lines. Input data can be received from the host apparatus, and output data can be delivered to the host apparatus via the I/O buffer.

Commands received from the host apparatus can be provided to a command interface 914. Command interface 914 can be configured to receive external control signals from the host apparatus, and determine whether data input to the input/output buffer 912 is write data, a command, or an address. Input commands can be transferred to a state machine 916.

State machine 916 can be configured to manage programming and reprogramming of integrated chip 902. State machine 916 receives commands from the host apparatus via input/output interface 912 and command interface 914, and manages read, write, erase, data input, data output, and like functionality associated with integrated chip 902. In some aspects, state machine 916 can send and receive acknowledgments and negative acknowledgments regarding successful receipt or execution of various commands.

To implement functionality of integrated chip 902, state machine 916 can control clock source(s) 908. Control of clock source(s) 908 can cause output pulses configured to facilitate row controller 904 and column controller 906 implementing the particular functionality. Output pulses can be transferred to selected subsets of the first set of data or control lines by column controller 906, for instance, or to selected subsets of the second set of data or control lines by row controller 904, for instance.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, calculating, determining, or displaying, and the like, refer to the action and processes of processing systems, and/or similar consumer or industrial electronic devices or machines, that manipulate or transform data represented as physical (electrical and/or electronic) quantities within the registers or memories of the electronic device(s), into other data similarly represented as physical quantities within the machine and/or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. An electronic device, comprising:
   a bit generator configured to generate a sequence of bits at a first bitrate;
   a sequence monitor configured to synchronize onto a received bit sequence having a second bitrate; and
   a test logic component configured to selectively facilitate generation of the sequence of bits at the second bitrate in conjunction with outputting the sequence of bits from the electronic device, wherein the first bitrate is different from the second bitrate and the sequence monitor is further configured to identify an error in the sequence of bits in response to the sequence of bits, having been generated at the second bitrate, being provided to the sequence monitor as the received bit sequence.

2. The electronic device of claim 1, further comprising a transmitter that is configured to output the sequence of bits from the electronic device.

3. The electronic device of claim 2, wherein the transmitter is configured to output the sequence of bits at the first bitrate in response to deactivation of the test logic component.

4. The electronic device of claim 2, wherein the transmitter is configured to output the sequence of bits at the second bitrate in response to activation of the test logic component.

5. The electronic device of claim 1, further comprising an output transmission interface and an input transmission interface, wherein the sequence of bits is output from the electronic device over the output transmission interface and the received bit sequence is input to the electronic device over the input transmission interface.

6. The electronic device of claim 5, the output transmission interface and the input transmission interface are configured to communicatively connect to an automated test equipment (ATE) device.

7. The electronic device of claim 6, wherein the test logic device is configured to convert the sequence of bits from the first bitrate to the second bitrate in response to connecting the electronic device to the ATE.

8. The electronic device of claim 7, wherein the sequence of bits converted to the second bitrate is output by the electronic device to the ATE, and wherein the ATE returns the sequence of bits to the input transmission interface of the electronic device for synchronization and monitoring by the sequence monitor.

9. The electronic device of claim 1, wherein the bit generator comprises a pseudo-random bit sequence generator.

10. The electronic device of claim 1, wherein the test logic component is configured to cause the bit generator to repeat a generated bit of the sequence of bits an integer number of times to reduce the bitrate from the first bitrate to the second bitrate.

11. The electronic device of claim 10, wherein the first bitrate is proportional to the second bitrate by a factor that is about equal or equal to the integer number.

12. The electronic device of claim 1, wherein the test logic component is configured to cause the bit generator to repeat each generated bit of the sequence of bits an integer number of times.

13. The electronic device of claim 1, wherein the bit generator comprises a framed pattern generator that is configured to generate the sequence of bits as a frame, and wherein the sequence monitor comprises a pattern framer and error monitor configured to recognize at least one known characteristic of a received frame as the received bit sequence, and identify the error from the at least one known characteristic of the received frame.

14. A method of testing a sequence generator of an electronic device, comprising:
   receiving an instruction to activate an electronic device test mode;
   generating a bit;
   repeating the generated bit an integer number of times n to produce n copies of the generated bit in response to receiving the instruction;
   outputting from the electronic device the generated bit and n copied bits as a sequence of bits; and
   receiving at the electronic device a second sequence of bits comprising the generated bit and n copied bits, and synchronizing onto the second sequence of bits.

15. The method of claim 14, wherein receiving the instruction is in response to the electronic device being connected to an automated test equipment for initiating self-test of the sequence generator.

16. The method of claim 14, further comprising selecting a value for the integer number n that is equal to a ratio of a bitrate of the sequence generator to a second bitrate corresponding to a sequence monitor of the electronic device.

17. The method of claim 14, wherein synchronizing onto the second sequence of bits includes error-checking the generated bit and n copied bits.

18. An electronic device, comprising:
   a bit sequence generator;
   a bit sequence monitor; and
   a sequence attenuator, wherein the bit sequence generator is configured to generate a sequence of bits having a bitrate within a first range of bitrates, wherein the bit sequence monitor is configured to receive bit sequences within a second range of bitrates, at least in part different from the first range of bitrates, and wherein the sequence attenuator is configured to selectively cause the bit sequence generator to repeat generated bits of the sequence of bits an integer number of times to reduce the bitrate to a second bitrate that is within the second range of bitrates.

19. The electronic device of claim 18, wherein the sequence attenuator is configured to cause the bit sequence generator to repeat the generated bits in response to the electronic device being connected to a test equipment.

20. The electronic device of claim 18, further comprising:
an output transmission interface configured to communicatively connect to an input of a test equipment; and
an input transmission interface configured to communicatively connect to an output of the test equipment, wherein:
the sequence of bits reduced to the second bitrate is provided via the output transmission interface to the input of the test equipment,
the input transmission interface receives the sequence of bits reduced to the second bitrate from the output of the test equipment, and
the bit sequence monitor is configured to identify an error in the sequence of bits and facilitate self-test by the electronic device of the bit sequence generator.

* * * * *